(12) United States Patent
Kwon et al.

(10) Patent No.: US 10,236,280 B2
(45) Date of Patent: Mar. 19, 2019

(54) LIGHT EMITTING DEVICE PACKAGE AND DISPLAY DEVICE USING THE SAME

(71) Applicant: SAMSUNG ELECTRONICS CO., LTD., Suwon-si (KR)

(72) Inventors: Yong Min Kwon, Seoul (KR); Kyoung Jun Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/827,843

(22) Filed: Nov. 30, 2017

(65) Prior Publication Data

US 2019/0019779 A1  Jan. 17, 2019

(30) Foreign Application Priority Data

Jul. 12, 2017 (KR) .................. 10-2017-0088400

(51) Int. Cl.
*H01L 29/06* (2006.01)
*H01L 25/075* (2006.01)
(Continued)

(52) U.S. Cl.
CPC ........ *H01L 25/0753* (2013.01); *H01L 25/167* (2013.01); *H01L 27/0248* (2013.01); *H01L 33/06* (2013.01); *H01L 33/30* (2013.01); *H01L 33/32* (2013.01); *H01L 33/58* (2013.01); *H01L 33/62* (2013.01); *H01C 7/12* (2013.01); *H01L 28/26* (2013.01); *H01L 29/866* (2013.01)

(58) Field of Classification Search
CPC ............... H01L 25/0753; H01L 25/167; H01L 27/0248; H01L 33/06; H01L 33/30; H01L 33/32; H01L 33/58; H01L 33/62; H01L 28/26; H01L 29/866; H01C 7/12
USPC ......................................................... 257/13
See application file for complete search history.

(56) References Cited

U.S. PATENT DOCUMENTS 6,372,608 B1  4/2002  Shimoda et al.
6,645,830 B2  11/2003  Shimoda et al.
(Continued)

FOREIGN PATENT DOCUMENTS

KR  10-2012-0032908 A  4/2012
KR  10-1224154 B1  1/2013
KR  10-1622399 B1  5/2016

*Primary Examiner* — Tu-Tu V Ho
(74) *Attorney, Agent, or Firm* — Sughrue Mion, PLLC

(57) ABSTRACT

A light emitting device package is provided. The light emitting device package includes three light emitting diode (LED) chips configured to emit light having different wavelengths, each of the three LED chips including a light emitting structure having a first conductivity-type semiconductor layer, a second conductivity-type semiconductor layer, and an active layer interposed between the first conductivity-type semiconductor layer and the second conductivity-type semiconductor layer; a through electrode portion disposed adjacent to the three LED chips; a molding portion encapsulating respective side surfaces of the three LED chips and the through electrode portion; a transparent electrode layer disposed on a first surface of the molding portion, the three LED chips, and the through electrode portion; and three individual electrodes exposed through a second surface of the molding portion and disposed on the three LED chips, respectively.

20 Claims, 19 Drawing Sheets

(51) Int. Cl.
   *H01L 25/16*  (2006.01)
   *H01L 33/06*  (2010.01)
   *H01L 33/30*  (2010.01)
   *H01L 33/32*  (2010.01)
   *H01L 33/62*  (2010.01)
   *H01L 27/02*  (2006.01)
   *H01L 33/58*  (2010.01)
   H01C 7/12  (2006.01)
   H01L 49/02  (2006.01)
   H01L 29/866  (2006.01)

(56) References Cited

U.S. PATENT DOCUMENTS

| | | |
|---|---|---|
| RE38,466 E | 3/2004 | Inoue et al. |
| 6,812,498 B1 | 11/2004 | Moon |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,044,415 B2 | 10/2011 | Messere et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,400,064 B2 | 3/2013 | Wei et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,598,619 B2 | 12/2013 | Kim et al. |
| 8,735,931 B2 | 5/2014 | Han et al. |
| 8,766,295 B2 | 7/2014 | Kim |
| 8,772,793 B2 | 7/2014 | Huang et al. |
| 9,209,372 B2 | 12/2015 | Illek |
| 9,461,091 B2 | 10/2016 | Yoon et al. |
| 9,490,397 B2 | 11/2016 | Preuß et al. |
| 2003/0071348 A1 | 4/2003 | Eguchi et al. |
| 2004/0005739 A1* | 1/2004 | Furusawa ......... G02F 1/136209 438/149 |
| 2004/0195576 A1* | 10/2004 | Watanabe ............... H01L 33/62 257/79 |
| 2008/0014677 A1 | 1/2008 | Xiaochun et al. |
| 2008/0116471 A1* | 5/2008 | Watanabe ............... H01L 33/10 257/98 |
| 2014/0091330 A1 | 4/2014 | Chen et al. |
| 2014/0159065 A1* | 6/2014 | Hu ..................... H01L 33/0079 257/88 |
| 2015/0280086 A1 | 10/2015 | Jang et al. |

* cited by examiner

'B'

'C'

LIGHT EMITTING DEVICE PACKAGE AND DISPLAY DEVICE USING THE SAME

CROSS-REFERENCE TO RELATED APPLICATION

This application claims priority from Korean Patent Application No. 10-2017-0088400, filed on Jul. 12, 2017 in the Korean Intellectual Property Office, the disclosure of which is incorporated herein by reference in its entirety.

BACKGROUND

1. Field

Methods and apparatuses consistent with example embodiments relate to a light emitting device package and a display device using the same.

2. Related Art

Semiconductor light emitting diodes (LEDs) have been used as light sources for lighting devices as well as light sources for various electronic products. In particular, semiconductor LEDs have commonly been used as light sources in the display panels of various devices, such as televisions (TVs), mobile phones, personal computers (PCs), laptop computers, and personal digital assistants (PDAs).

Display devices frequently include a liquid crystal display (LCD) and a backlight. Recently, display devices that do not require separate backlights, have been developed. These display devices may use LED devices as individual pixels. Such display devices may not only be compact, but may also emit a relatively high luminance with greater efficiency. In addition, because the aspect ratio of a display screen may be freely changed and may be implemented to have a large area, such display devices may be provided as large displays.

SUMMARY

One or more example embodiments provide a light emitting device package requiring reduced manufacturing costs and able to be easily miniaturized, as well as a display device.

According to an aspect of an example embodiment, there is provided a light emitting device package, including: three light emitting diode (LED) chips configured to emit light having different wavelengths, each of the three LED chips including a light emitting structure having a first conductivity-type semiconductor layer, a second conductivity-type semiconductor layer, and an active layer interposed between the first conductivity-type semiconductor layer and the second conductivity-type semiconductor layer; a through electrode portion disposed adjacent to the three LED chips; a molding portion encapsulating respective side surfaces of the three LED chips and the through electrode portion to connect the three LED chips and the through electrode portion to each other; a transparent electrode layer disposed on a first surface of the molding portion, the three LED chips, and the through electrode portion; and three individual electrodes exposed through a second surface of the molding portion and disposed on the three LED chips, respectively According to an aspect of another example embodiment, there is provided a light emitting device package, including: a transparent electrode layer; a plurality of light emitting diode (LED) chips configured to emit light having different wavelengths, spaced apart from each other and disposed on the transparent electrode layer, each of the plurality of LED chips having a first surface connected to the transparent electrode layer and a second surface opposite the first surface, and the transparent electrode layer being provided as a common electrode of the plurality of LED chips; a plurality of individual electrodes, each of which is disposed on the second surface of the plurality of LED chips, respectively; a through electrode portion having a first through electrode portion surface connected to the transparent electrode layer and a second through electrode portion surface disposed opposite the first through electrode portion surface; and a molding portion encapsulating the plurality of LED chips and the through electrode portion, through which the plurality of individual electrodes and the second through electrode portion surface are exposed.

According to an aspect of yet another example embodiment, there is provided a display device including: a display panel including a circuit board and a plurality of light emitting device packages disposed on the circuit board in rows and columns; a panel driver configured to drive the display panel; and a controller configured to drive the panel driver, wherein each of the plurality of light emitting device packages includes a plurality of light emitting diode (LED) chips configured to emit light having different wavelengths, wherein each of the plurality of LED chips includes a first conductivity-type semiconductor layer, a second conductivity-type semiconductor layer, an active layer interposed between the first conductivity-type semiconductor layer and the second conductivity-type semiconductor layer, a first surface provided by the first conductivity-type semiconductor layer and a second surface opposite the first surface, and wherein each of the plurality of light emitting device packages includes a molding portion encapsulating respective side surfaces of the plurality of LED chips, a transparent electrode layer disposed on the first surface of the plurality of LED chips and electrically connected to the first conductivity-type semiconductor layer of the plurality of LED chips, a through electrode portion penetrating through the molding portion to connect to the transparent electrode layer, and a plurality of individual electrodes, each which is disposed on the second surface of the plurality of LED chips and exposed to the molding portion.

BRIEF DESCRIPTION OF THE DRAWINGS

The above and other aspects will be more clearly understood from the following detailed description, when taken in conjunction with the accompanying drawings in which.

DETAILED DESCRIPTION

Example embodiments will now be described in detail with reference to the accompanying drawings.

Expressions such as "at least one of" when preceding a list of elements, modify the entire list of elements and do not modify the individual elements of the list.

Figure 1:
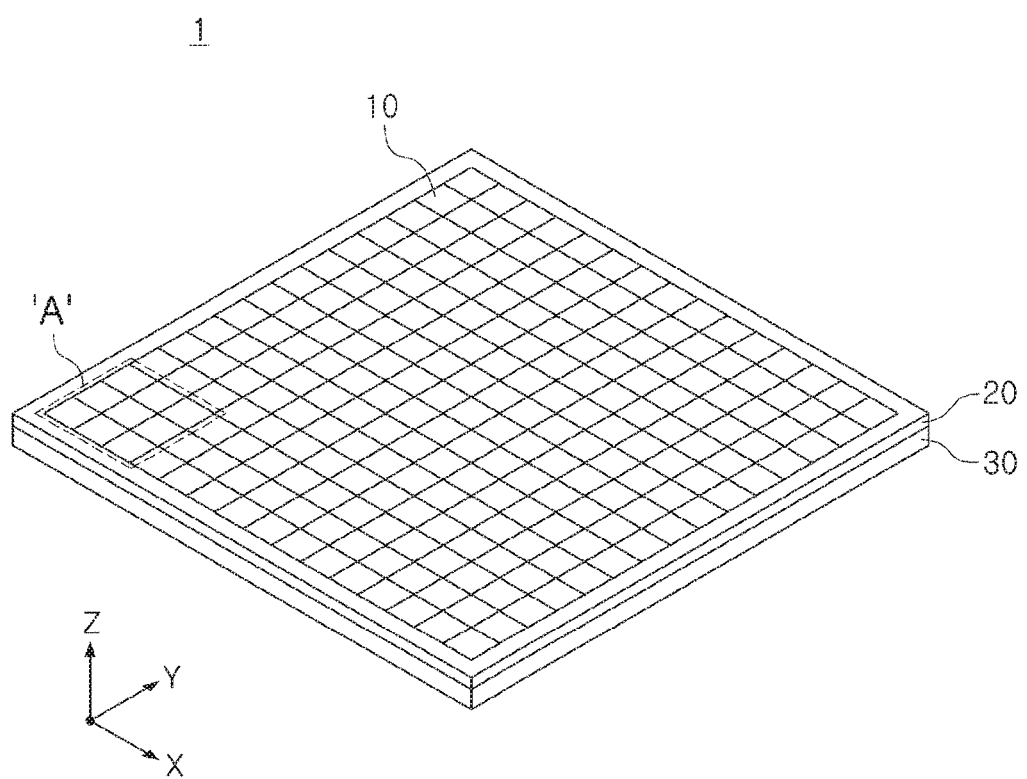
FIG. 1 is a schematic perspective view of a display panel including a light emitting device package according to an example embodiment.
Figure 2:
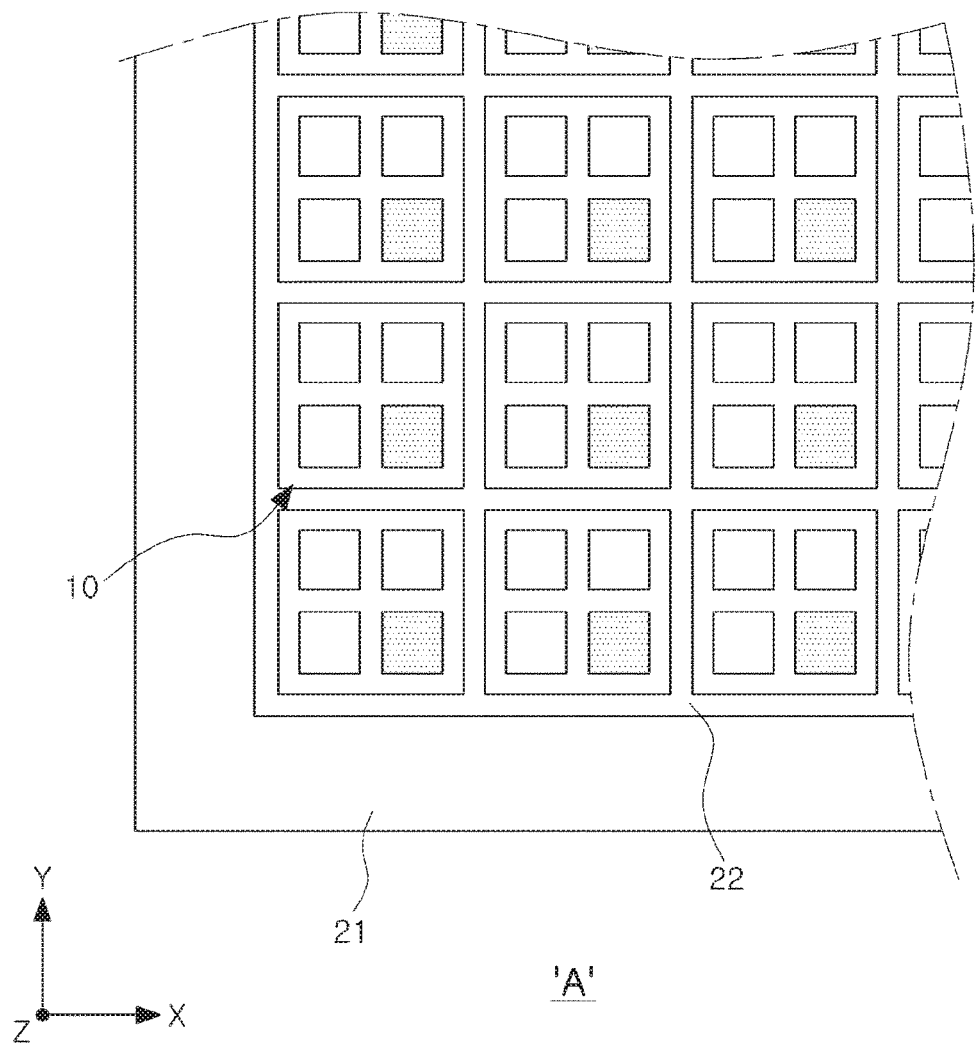
FIG. 2 is an enlarged top view of portion 'A' of FIG. 1.

FIG. 1 is a schematic perspective view of a display panel including a light emitting device package according to an example embodiment, while FIG. 2 is an enlarged top view of portion 'A' of FIG. 1.

With reference to FIG. 1, a display panel 1 may include a circuit board 30 and a light emitting device module 20 arranged on the circuit board 30.

The light emitting device module 20 according to an example embodiment may include a plurality of light emitting device packages 10 selectively emitting red (R), green (G), and blue (B) light. Each of the plurality of light emitting device packages 10 may form a single pixel of a display panel and may be arranged on the circuit board 30 in rows and columns. In an example embodiment, light emitting device packages are arranged in a 15×15 array; however, this is for the sake of convenience of description. According to various example embodiments, larger or smaller number of light emitting device packages may be arranged (e.g., 1024× 768, 1920×1080) according to a required resolution.

Each of the light emitting device packages 10 may include a plurality of sub-pixels corresponding to red, blue and green (RGB) light sources. The plurality of sub-pixels in a single light emitting device package 10 may be provided to have a structure in which the plurality of sub-pixels are spaced apart from each other. Detailed descriptions thereof will be provided below with reference to FIGS. 3 to 6. However, sub-pixel colors are not limited to RGB, and various colors, such as cyan, yellow, magenta, and black (CYMK), may be used. In addition, although the illustrated example embodiment shows three sub-pixels are included in a single pixel, example embodiments are not limited thereto. For example, four or more sub-pixels may be included in a single sub-pixel.

According to an example embodiment, a driving portion configured to supply power to each light emitting device package 10 of the light emitting device module 20 and a control portion controlling the light emitting device package 10 may also be disposed on the circuit board 30. The circuit board 30 may include a circuit configured to independently drive each sub-pixel of each pixel. For example, the circuit board 30 may be provided as a thin film transistor (TFT) substrate including one or more TFTs.

With reference to FIG. 2, the display panel 1 may further include a first partition structure 21 which surrounds an area in which the plurality of light emitting device packages 10 are disposed on a circuit board 30. In addition, each of the plurality of light emitting device packages 10 may be surrounded by a second partition structure 22. The second partition structure 22 may electrically isolate each light emitting device package 10 so that each light emitting device package 10 may be independently driven as a single pixel. In addition, the second partition structure 22 may firmly fix the plurality of light emitting device packages 10 to the circuit board 30. However, the first partition structure 21 and the second partition structure 22 may be omitted, according to an example embodiment.

The first partition structure 21 and the second partition structure 22 may include a black matrix. In detail, the black matrix may be disposed on a perimeter of the circuit board 30 to function as a guide line to define a mounting area of the plurality of light emitting device packages 10. A matrix described above is not limited to being black, and a matrix of other colors, such as a white matrix or a green matrix, may be used depending on an application of a product. According to need, a transparent matrix may also be used. The white matrix may further include a reflective material or a light scattering material. The black matrix may include at least one material among a polymer, a ceramic, a semiconductor or a metal.

Figure 3:
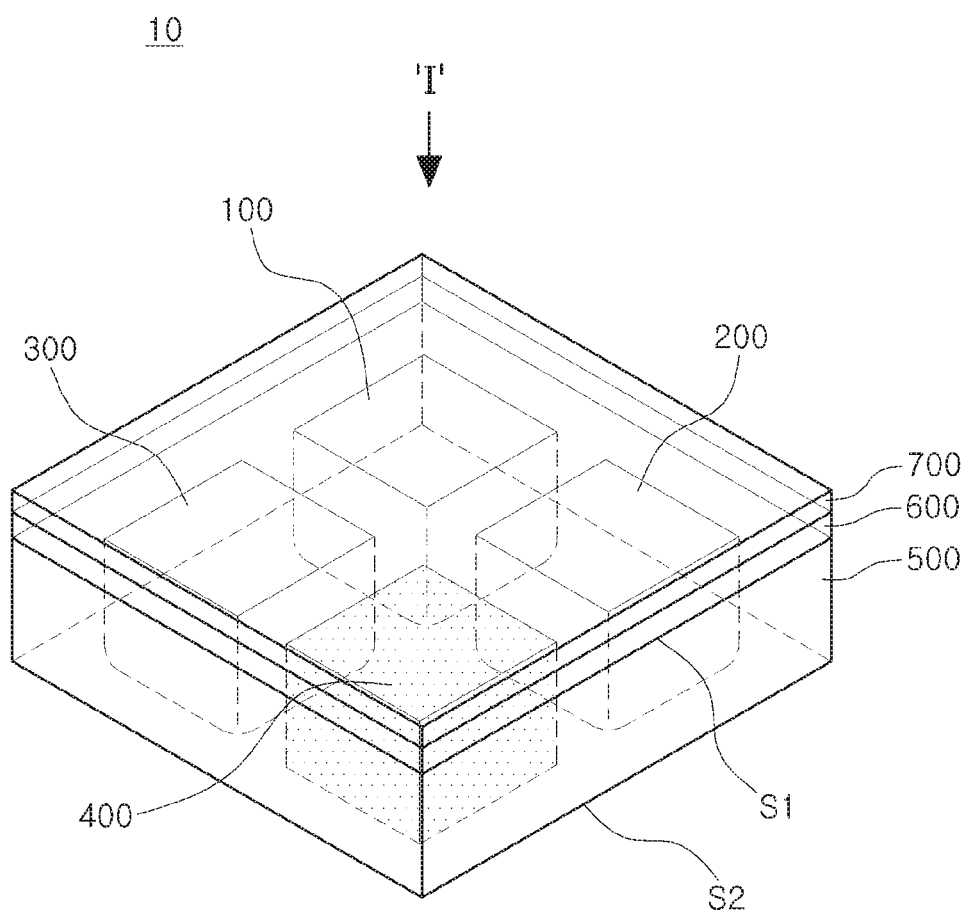
FIG. 3 is a schematic perspective view of a light emitting device package of FIG. 1.
Figure 4:
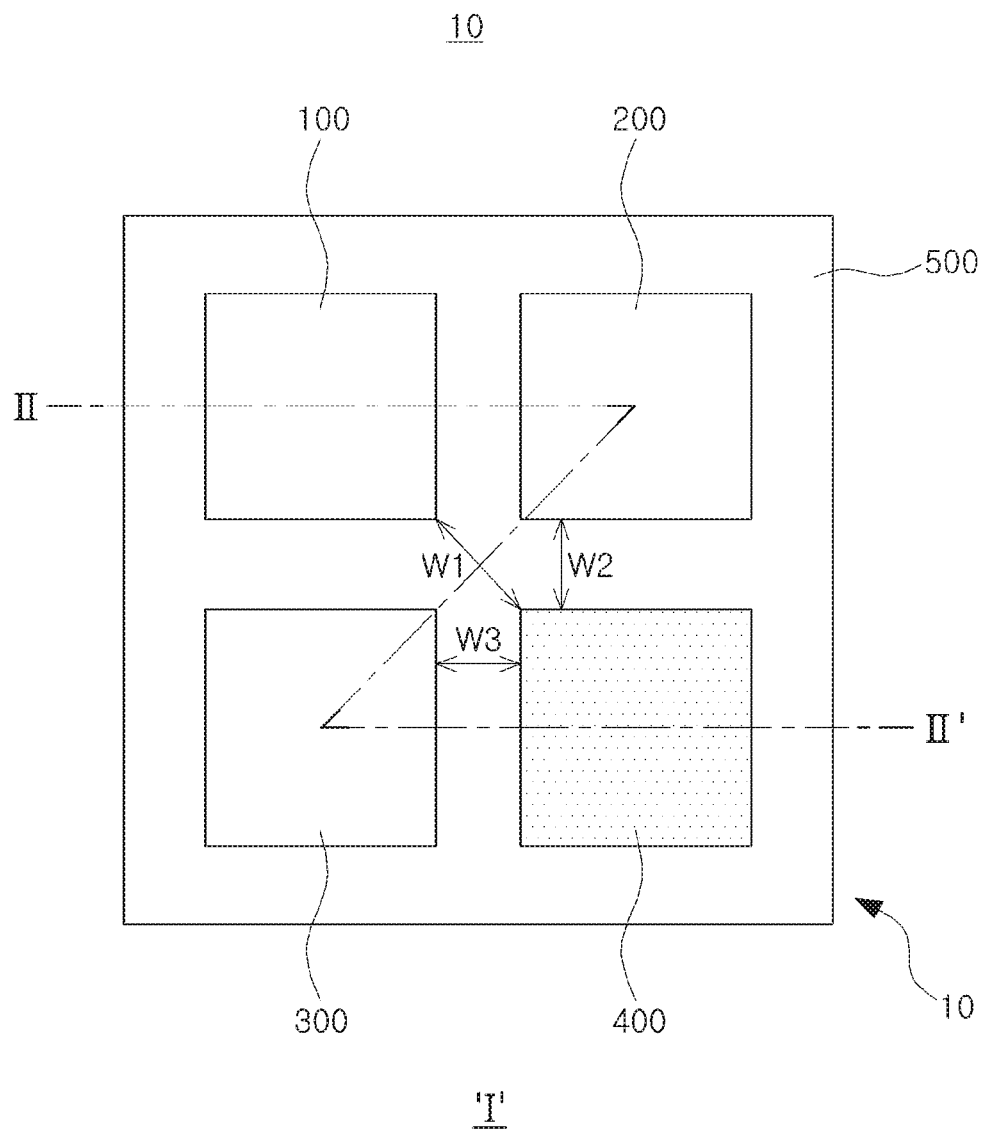
FIG. 4 is a top view of a light emitting device package taken in direction 'I' of FIG. 4.
Figure 5:
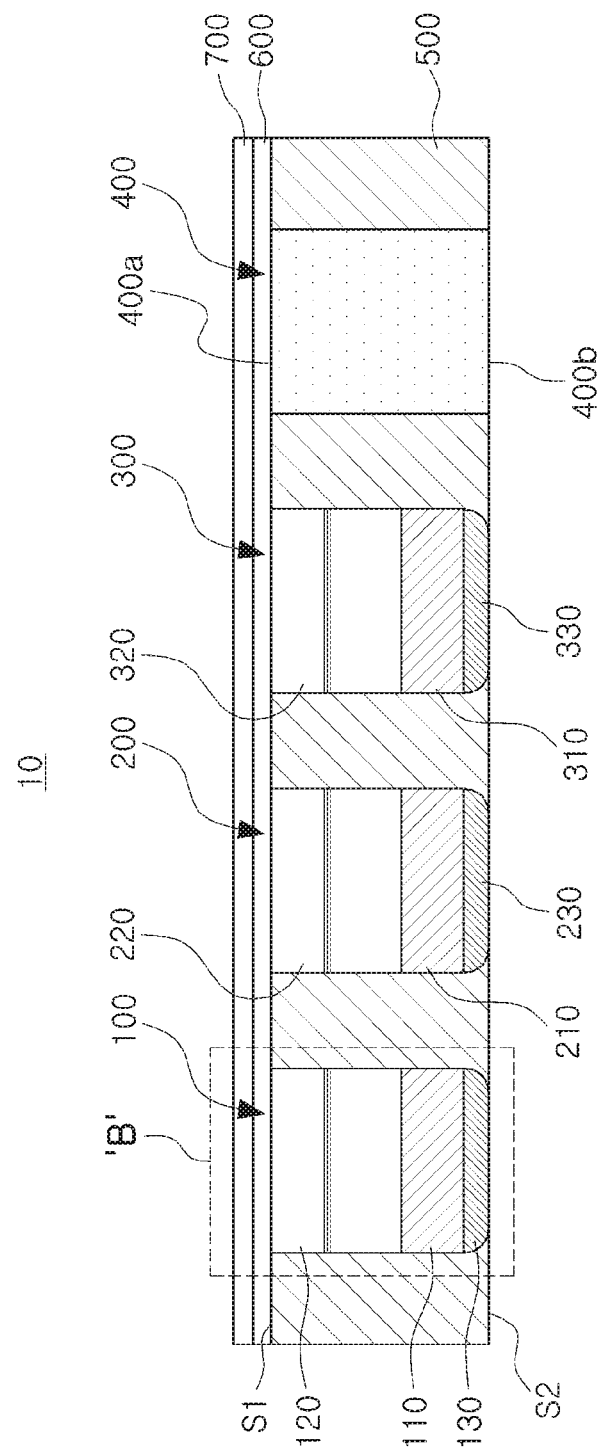
FIG. 5 is a side cross-sectional view taken along line II-II' of FIG. 4.
Figure 6:
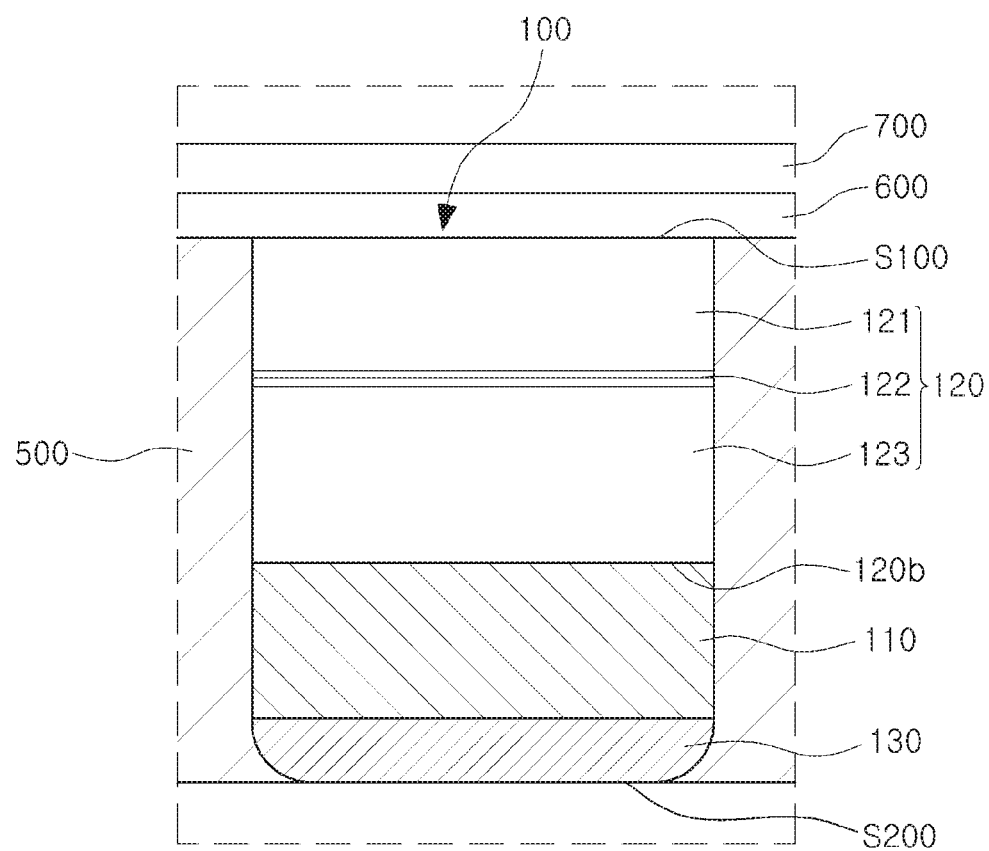
FIG. 6 is an enlarged view of portion 'B' of FIG. 5.
Figure 7A:
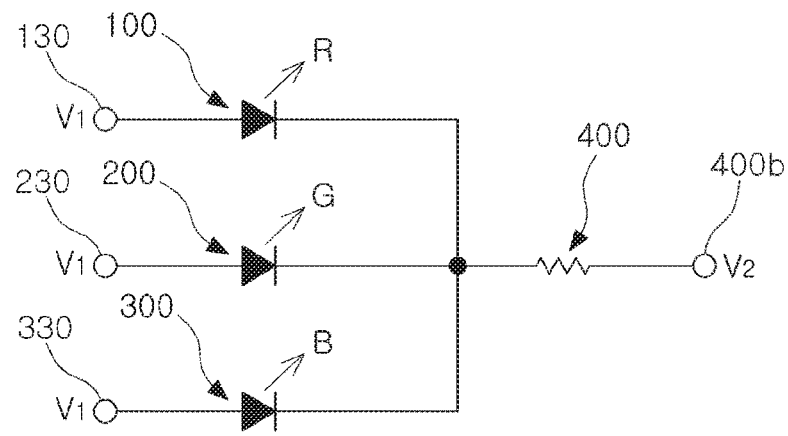
FIG. 7A is a circuit diagram of a light emitting device package of FIG. 5.

FIG. 3 is a schematic perspective view of a light emitting device package of FIG. 1, while FIG. 4 is a top view of a light emitting device package taken in direction 'I' of FIG. 4. FIG. 5 is a side cross-sectional view taken along line II-II' of FIG. 4, while FIG. 6 is an enlarged view of portion 'B' of FIG. 5. FIG. 7A is a circuit diagram of a light emitting device package of FIG. 5.

With reference to FIGS. 4 and 5, each light emitting device package 10 forming a single pixel may include a first LED chip 100, a second LED chip 200, and a third LED chip 300, which are sub-pixels, as well as a molding portion 500, a transparent electrode layer 600, a through electrode portion 400, and an individual electrode 130.

When viewed from above the light emitting device package 10 (an 'I' direction), the first LED chip 100, the second LED chip 200, the third LED chip 300, and the through electrode portion 400 may be disposed in rows and columns, but example embodiments are not limited thereto. Because structures of the first LED chip 100, the second LED chip 200, and the third LED chip 300 are similar to each other, descriptions thereof will be provided based on the first LED chip 100.

With reference to FIG. 6, the first LED chip 100 may have a first surface S100 and a second surface S200, disposed to oppose each other. The first LED chip 100 may also include a support substrate 110, a light emitting structure 120 disposed on the support substrate 110, and an individual electrode 130 disposed below the support substrate 110.

The support substrate 110 may be a substrate formed using a conductive material or a semi-conductive material, or an insulating substrate having an electrode structure. For example, the insulating substrate may have a conductive via penetrating through the support substrate 110 in a vertical direction.

In a case in which the support substrate 110 is formed using a conductive material, the support substrate 110 may be formed in such a manner that a substrate including silicon carbide (SiC), silicon (Si), gallium arsenide (GaAs), gallium phosphide (GaP), aluminum gallium indium phosphide (AlGaInP), germanium (Ge), silicon-selenide (SiSe), gallium nitride (GaN), aluminum indium gallium nitride (AlInGaN) or indium gallium nitride (InGaN), or a single metal, such as aluminum (Al), zinc (Zn), silver (Ag), tungsten (W), titanium (Ti), nickel (Ni), gold (Au), molybdenum (Mo), platinum (Pt), palladium (Pd), copper (Cu), chromium (Cr) or iron (Fe), or an alloy substrate, such as Si—Al, is attached to the light emitting structure 120. In an example embodiment, a SiC substrate may be used.

The support substrate 110 may support the light emitting structure 120, which may be easily damaged, and may function as a p-side electrode supplying power to a second conductivity-type semiconductor layer 123 to be subsequently described.

The support substrate 110 may be attached to the light emitting structure 120 by a conductive bonding layer 120b. The conductive bonding layer 120b may improve adhesion between the second conductivity-type semiconductor layer 123 and the support substrate 110 and may, generally, be formed using a bondable conductive material. Au may be used as the conductive bonding layer, and a eutectic metal, such as Au/germanium (Ge), Au/indium (In), Au/tin (Sn) and lead (Pb)/Sn may also be used. In addition, a conductive organic material may be used as the conductive bonding layer. Furthermore, the support substrate 110 may be formed using a plating process. In other words, the support substrate 110 may be formed by plating a metal, such as Cu or Ni, on the light emitting structure 120.

The light emitting structure 120 may include a second conductivity-type semiconductor layer 123, an active layer 122, and a first conductivity-type semiconductor layer 121, sequentially disposed on the support substrate 110. The first conductivity-type semiconductor layer 121 may provide the first surface S100 of the first LED chip 100. The first conductivity-type semiconductor layer 121 and the second conductivity-type semiconductor layer 123 may be provided as an n-type semiconductor layer and a p-type semiconductor layer, respectively. For example, the first conductivity-type semiconductor layer 121 and the second conductivity-type semiconductor layer 123 may be provided as a nitride semiconductor having a composition of $Al_xIn_yGa_{(1-x-y)}N$ ($0 \leq x \leq 1$, $0 \leq y \leq 1$, $0 \leq x+y \leq 1$), but example embodiments are not limited thereto. A GaAs-based semiconductor or a GaP-based semiconductor may be used as the first conductivity-type semiconductor layer 121 and the second conductivity-type semiconductor layer 123. The active layer 122 may have a multiple quantum well (MQW) structure in which a quantum well layer and a quantum barrier layer are alternately stacked. For example, the active layer 122 may be provided as a nitride-based MQW, such as InGaN/GaN and GaN/AlGaN, but is not limited thereto. The active layer 122 may also be provided as a different semiconductor, such as GaAs/AlGaAs, InGaP/GaP, or GaP/AlGaP. In an example embodiment, the first light emitting structure 120 may be formed using a semiconductor material different from a second light emitting structure 220 and a third light emitting structure 320. In detail, the first light emitting structure 120 may be formed using GaAs, while the second light emitting structure 220 and the third light emitting structure 320 may be formed using GaN.

Each active layer of the first light emitting structure 120, the second light emitting structure 220, and the third light emitting structure 320 may be configured to emit light having different wavelengths. Such emitted light may be implemented using various methods. In an example embodiment, active layers of the first light emitting structure 120, the second light emitting structure 220, and the third light emitting structure 320 may be configured to emit light of different colors. For example, the active layers of the first light emitting structure 120, the second light emitting structure 220, and the third light emitting structure 320 may emit red, green, and blue light, respectively. Thus, the first LED chip 100, the second LED chip 200, and the third LED chip 300 may emit red, green, and blue light, respectively, without a separate phosphor layer and may act as a sub-pixel corresponding to RGB light sources.

An LED chip having a so-called 'vertical structure' in which an n-side electrode and a p-side electrode applying power to the first conductivity-type semiconductor layer 121 and the second conductivity-type semiconductor layer 123, respectively, are disposed on opposing surfaces of the first LED chip 100 may be used as the first LED chip 100. In an example embodiment, the transparent electrode layer 600 to be subsequently described may be used as the n-side electrode, while the support substrate 110 may be used as the p-side electrode.

As illustrated in FIG. 4, when taken in direction 'I', the first LED chip 100, the second LED chip 200, and the third LED chip 300 may have quadrangular top surfaces of equal areas, but example embodiments are not limited thereto. The first LED chip 100, the second LED chip 200, and the third LED chip 300 may have different areas.

The first LED chip 100, the second LED chip 200, and the third LED chip 300 may be disposed in rows and columns together with the through electrode portion 400 to be subsequently described, but example embodiments are not limited thereto.

In addition, a gap W1 between the first LED chip 100 and the through electrode portion 400 may be greater than a gap W2 between the second LED chip 200 and the through electrode portion 400 or a gap W3 between the third LED chip 300 and the through electrode portion 400.

In a case in which the first light emitting structure 120 is formed using GaAs, and the second light emitting structure 220 and the third light emitting structure 320 are formed using GaN, a driving voltage (about 2 V) of the first light emitting structure 120 may be lower than a driving voltage (about 3 V) of the second light emitting structure 220 and the third light emitting structure 320. Thus, in order to operate the first LED chip 100, the second LED chip 200, and the third LED chip 300 by applying the same degree of driving voltage thereto, an additional voltage dropping unit is required to reduce a degree of voltage applied to the first LED chip 100.

In a case in which the gap W1 between the first LED chip 100 and the through electrode portion 400 is greater than the gap W2 between the second LED chip 200 and the through electrode portion 400 or the gap W3 between the third LED chip 300 and the through electrode portion 400, an electrical distance of the transparent electrode layer 600 connecting the first LED chip 100 to the through electrode portion 400 is increased. Thus, the degree of voltage applied to the first LED chip 100 may be reduced without an additional voltage dropping unit. Thus, the first LED chip 100, the second LED chip 200, and the third LED chip 300 may be operated by applying the same degree of driving voltage thereto, without an additional voltage dropping unit.

With reference to FIG. 5, the molding portion 500 may be disposed to encapsulate side surfaces of the first LED chip 100, the second LED chip 200, the third LED chip 300, and the through electrode portion 400 to have a predetermined thickness so that the molding portion 500 may have a first surface S1 and a second surface S2 on a surface opposed thereto.

The molding portion 500 may be formed using a black or transparent matrix, as described above, so that the molding portion 500 may connect the first LED chip 100, the second LED chip 200, the third LED chip 300, and the through electrode portion 400 to each other and may have sufficient mechanical strength to maintain an exterior of the light emitting device package 10. According to an example embodiment, the molding portion 500 may be formed using the same material as the transparent electrode layer 600. For example, the molding portion 500 may be formed using a light transmissive polymer resin including at least one of an Ag nanowire and a carbon nanotube (CNT) and having conductivity. In addition, the molding portion 500 may be integrally formed using the same material as the transparent electrode layer 600. Thus, according to an example embodiment, the molding portion 500 and the transparent electrode layer 600 may be integrally formed using a single process.

With reference to FIGS. 5 and 6, the transparent electrode layer 600, which connects the first LED chip 100, the second LED chip 200, the third LED chip 300 and the through electrode portion 400, may be disposed on the first surface S1 of the molding portion 500. The transparent electrode layer 600 may electrically connect the first surface S100 of each of the first LED chip 100, the second LED chip 200, and the third LED chip 300, exposed on the first surface S1 of the molding portion 500, to a first surface 400a of the through electrode portion 400.

The transparent electrode layer 600 may employ a transparent conductive oxide (TCO) material, such as indium tin oxide (ITO), zinc-doped indium tin oxide (ZITO), zinc indium oxide (ZIO), gallium indium oxide (GIO), zinc tin oxide (ZTO), fluorine-doped tin oxide (FTC)), aluminum-doped zinc oxide (AZO), gallium-doped zinc oxide (GZO), $In_4Sn_3O_{12}$, or $Zn_{(1-x)}Mg_xO$ (zinc magnesium oxide, $0 \leq x \leq 1$). The transparent electrode layer 600 may employ a light transmissive polymer resin including at least one of an Ag nanowire and a carbon nanotube (CNT) and having conductivity.

The transparent electrode layer 600 may be formed to cover an entirety of first surface S1 of the molding portion 500. However, the transparent electrode layer 600 may also be formed so as to have a pattern within a range in which the first LED chip 100, the second LED chip 200, the third LED chip 300, and the through electrode portion 400 are connected to each other. In addition, the transparent electrode layer 600 may be formed so as to cover an entirety of first surface S100 of each of the first LED chip 100, the second LED chip 200, and the third LED chip 300. However, the transparent electrode layer 600 may be formed so as to only cover respective portions of first surface S100 of each of the first LED chip 100, the second LED chip 200, and the third LED chip 300. Alternatively, an opening may be formed in the transparent electrode layer 600, thereby improving light transmittance of the transparent electrode layer 600.

According to an example embodiment, a passivation layer 700 for protecting the transparent electrode layer 600 may be further disposed on the transparent electrode layer 600.

The through electrode portion 400 may penetrate through the molding portion 500, so that the first surface 400a and a second surface 400b of the through electrode portion 400 are exposed on the first surface S1 and the second surface S2 of the molding portion 500, respectively. The through electrode portion 400 may be disposed adjacent to the first LED chip 100, the second LED chip 200, and the third LED chip 300 at a height the same thereas. The first surface 400a and the second surface 400b may be formed to have the same area as the first surface S100 of the first LED chip 100, the second LED chip 200, and the third LED chip 300. In addition, as illustrated in FIG. 4, when viewed from above, the through electrode portion 400 may be disposed together with the first LED chip 100, the second LED chip 200, and the third LED chip 300 in rows and columns, but example embodiments are not limited thereto.

The through electrode portion 400 may be connected to the transparent electrode layer 600 covering the first surface S1 of the molding portion 500, thereby electrically connecting the first surface S1 of the molding portion 500 to the second surface S2 thereof. Thus, in a case in which a voltage V2 is applied to the second surface 400b of the through electrode portion 400 and a voltage V2 is applied to individual electrodes 130, 230, and 330 of the first LED chip 100, the second LED chip 200, and the third LED chip 300, respectively, a circuit illustrated in FIG. 7A may be configured.

With reference to FIG. 7A, when the voltage V1 and the voltage V2 are applied to a plurality of individual electrodes 130, 230, and 330 and the second surface 400b of the through electrode portion 400, respectively, the first LED chip 100, the second LED chip 200, and the third LED chip 300, may be electrically connected in parallel, while the through electrode portion 400 may be connected to the first LED chip 100, the second LED chip 200, and the third LED chip 300, in series.

The through electrode portion 400 may include at least one of a metal, a metal polymer composite, a zener diode, and a varistor. FIG. 7A illustrates a case in which the through electrode portion 400 is formed using a metal or a metal polymer composite, in order to be operated in the same manner as a resistor having a predetermined resistance value. Thus, in a case in which power is applied to the through electrode portion 400 and individual electrodes 130, 230, and 330 of the first LED chip 100, the second LED chip 200, and the third LED chip 300, the through electrode portion 400 may be electrically connected to the first LED chip 100, the second LED chip 200, and the third LED chip 300, in series.

In general, even though LED chips are manufactured on a single wafer, driving voltages thereof may be different from each other. As such, in a case in which the same driving voltage is applied to a plurality of LED chips having different driving voltages, light emitted from a light emitting structure of an LED chip may cause a difference in light intensity. In a case in which a light emitting device package having the plurality of LED chips described above as a sub-pixel is used as a pixel of a display, a difference in light intensity may occur between sub-pixels. Thus, color characteristics of pixels (brightness, color, color temperatures, and the like) may be non-uniform. In an example embodiment, after a driving voltage of the plurality of LED chips is measured in advance, the through electrode portion 400 having a resistance value appropriate for the measured driving voltage may be disposed in each light emitting device package, so that a driving voltage applied may be reduced to the measured driving voltage. Thus, the color characteristics of pixels may be uniform.

Figure 7B:
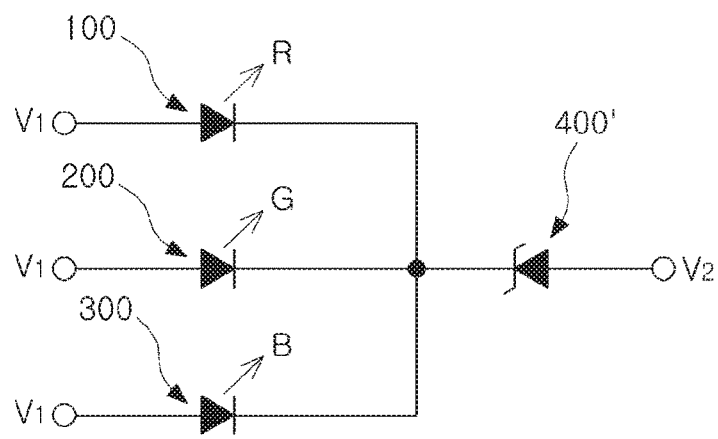
FIGS. 7B and 7C are modified examples of FIG. 7A.
Figure 7C:
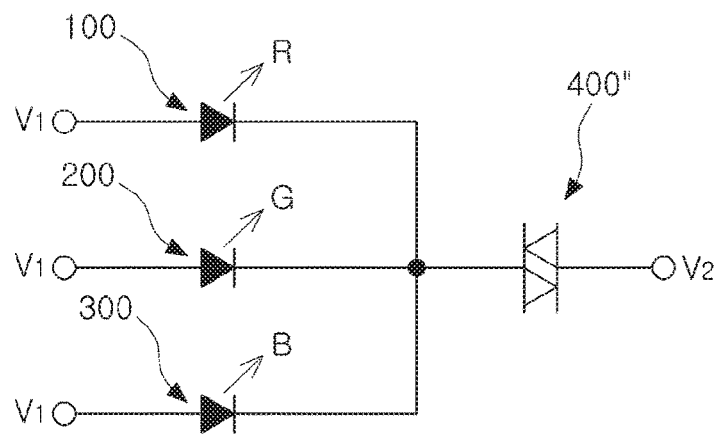

In addition, in a case in which the through electrode portion 400 includes a protection device, such as a zener diode or a varistor, the first LED chip 100, the second LED chip 200, and the third LED chip 300 may be protected from electrostatic discharge (ESD). FIG. 7B illustrates a case in which a through electrode portion 400' is provided as a zener diode, while FIG. 7C illustrates a case in which a through electrode portion 400" is formed using a varistor.

The individual electrodes 130, 230, and 330 that connect the light emitting device package 10 to the circuit board 30 may be disposed below each support substrate 110 of the first LED chip 100, the second LED chip 200, and the third LED chip 300. The individual electrodes 130, 230, and 330 may provide the second surface S200 of the first LED chip 100 and may be coplanar with the second surface S2 of the molding portion 500, in order to be used to connect the light emitting device package 10 to the circuit board 30.

FIG. 2 illustrates a case in which a single light emitting device package 10 corresponds to a single pixel, as an example, but example embodiments are not limited thereto.

Figure 8:
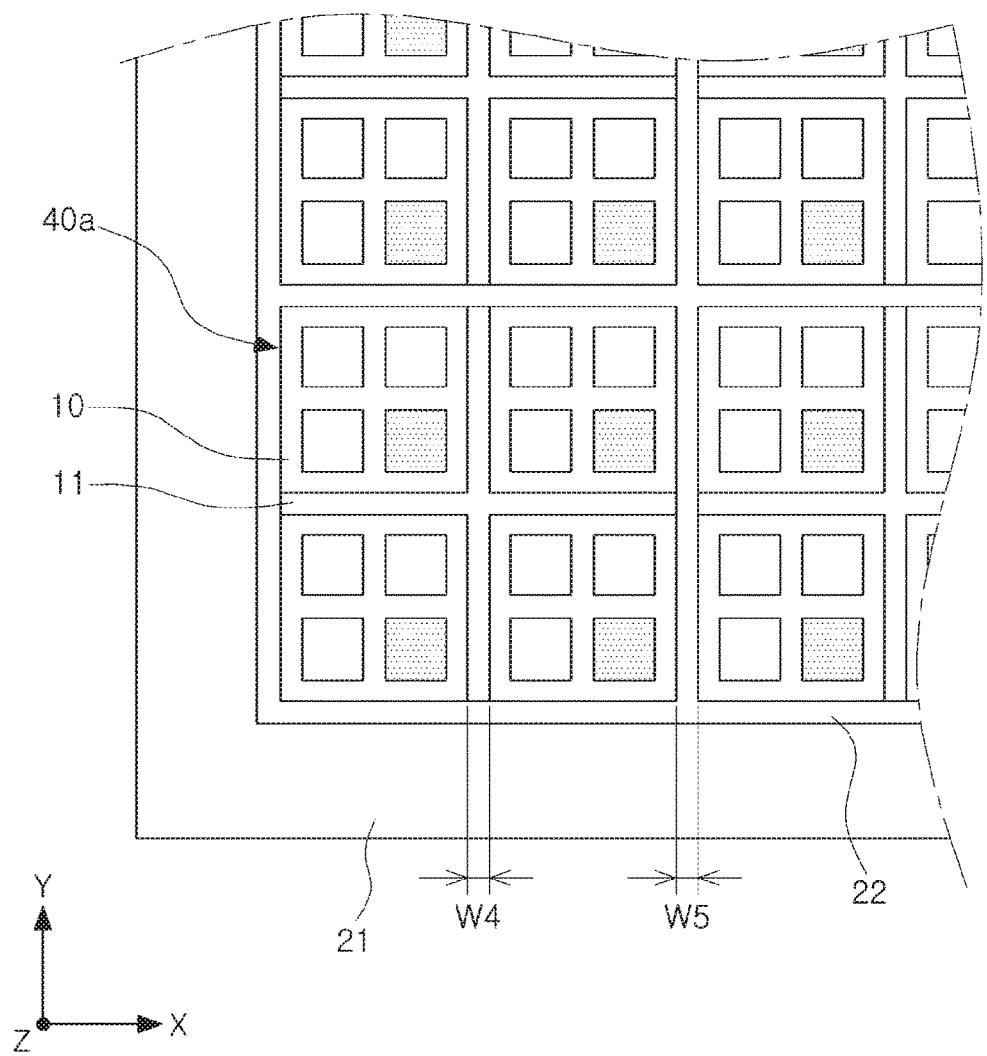
FIG. 8 is a modified example of a light emitting device package.

As illustrated in FIG. 8, a light emitting device package array 40 including four light emitting device packages 10 may be employed. Providing multiple light emitting device packages 10 on a light emitting device package array 40 may reduce the time required for arranging a light emitting device package on a circuit board. Also, it can be confirmed that the four light emitting device packages 10 are connected through a connection portion 11 having not been removed in a dicing process. A gap W4, between the light emitting device packages 10 forming the light emitting device package array 40, may be equal to a gap W5, between the light emitting device package arrays 40, so that the plurality of light emitting device packages 10 may have equal gaps therebetween when viewed from above.

In the case of the light emitting device package described above, a plurality of LED chips may be connected in parallel through a transparent electrode layer and a through electrode portion, and power may be applied to each of the plurality of LED chips. Thus, a separate process of forming an electrode pattern to form an electrode connected to each of the plurality of LED chips is unnecessary. Thus, in the case of the light emitting device package of an example manufacturing time and costs may be reduced. In addition, because no separate wiring is required, the light emitting device package may be easily miniaturized.

Figure 9:
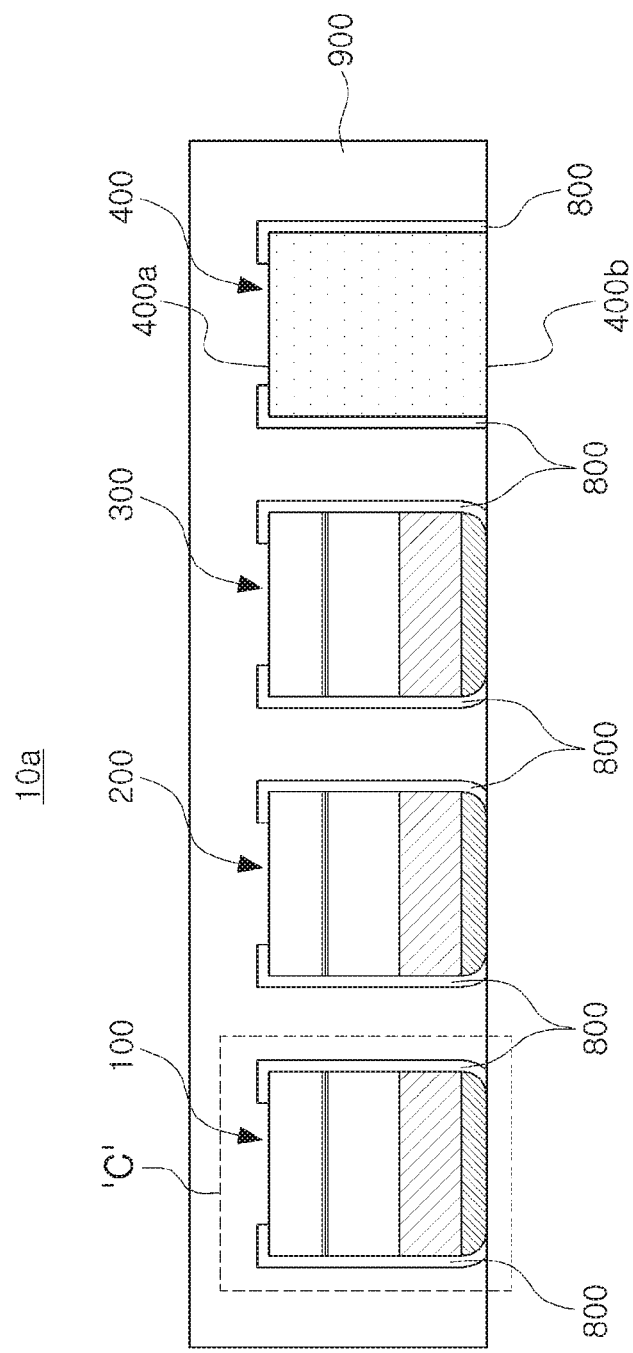
FIG. 9 is a side cross-sectional view of a light emitting device package according to an example embodiment.
Figure 10:
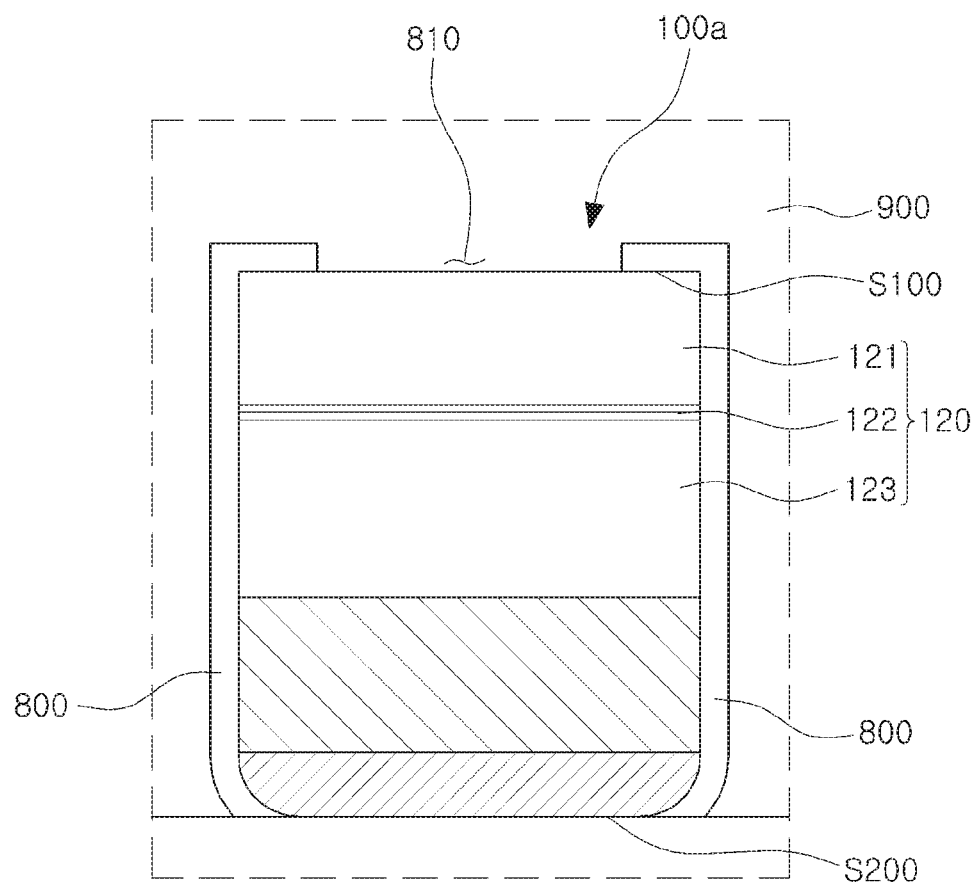
FIG. 10 is an enlarged view of portion 'C' of FIG. 9.

In FIGS. 9 and 10, a light emitting device package 10a having a structure different from that of an example embodiment described above is illustrated.

With reference to FIG. 10, the light emitting device package 10a according to an example embodiment may include a first LED chip 100 similar to the example embodiment described above.

As compared to an example embodiment described above with reference to FIG. 5, an insulating layer 800 may be disposed so as to cover side surfaces of the first LED chip 100 and the through electrode portion 400, while a transparent electrode portion is integrally formed using the same material as the molding portion 900. The insulating layer 800 may be extended to an area of a first surface S100 of the first LED chip 100 and a first surface 400a of the through electrode portion 400.

The molding portion 900 may be formed using a light transmissive polymer resin including at least one of an Ag nanowire and a CNT, so that the molding portion 900 may have conductivity and sufficient mechanical strength to maintain an exterior of a light emitting device package 10a. Thus, because the transparent electrode layer and the molding portion may be manufactured simultaneously, the time required for manufacturing the light emitting device package 10a may be further reduced.

The insulating layer 800 may be interposed between the first LED chip 100, the second LED chip 200, the third LED chip 300, and the through electrode portion 400 and the molding portion 900, thereby insulating the side surfaces of the first LED chip 100, the second LED chip 200, the third LED chip 300, and the through electrode portion 400 from the molding portion 900. An opening 810 may be disposed in respective areas in which first surfaces of the first LED chip 100, the second LED chip 200, the third LED chip 300, and the through electrode portion 400 are in contact with the insulating layer 800, thereby being defined as an area connected to the molding portion 900. For example, the insulating layer 800 may include a silicon oxide and a silicon nitride, such as $SiO_2$, $SiO_xN_y$, and $Si_xN_y$.

According to an example embodiment, a display device may include a display panel including a circuit board and a plurality of light emitting device packages disposed on the circuit board in rows and columns.

A process of manufacturing a light emitting device package 10 illustrated in FIG. 5 will be described. FIGS. 11 to 15 are schematic, side cross-sectional views illustrating a process of manufacturing a light emitting device package of FIG. 5.

Figure 11:
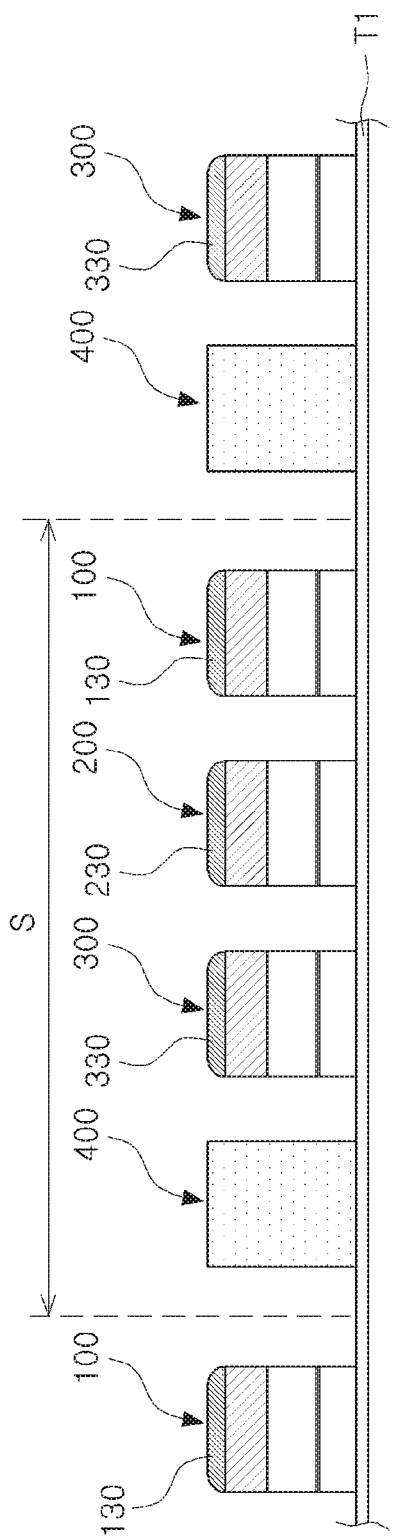
FIGS. 11 to 15 are schematic, side cross-sectional views illustrating a process of manufacturing a light emitting device package according to an example embodiment.

First, as illustrated in FIG. 11, a first LED chip 100, a second LED chip 200, a third LED chip 300, and a through electrode portion 400 may be provided and repeatedly arranged on a surface of a first adhesive film T1 in groups of pixel unit S. A UV-sensitive film, adhesive strength of which is reduced when UV light is irradiated, may be used as a first adhesive film T1. The first LED chip 100, the second LED chip 200, and the third LED chip 300 may be arranged such that individual electrodes 130, 230, and 330 may be exposed in upper portions thereof.

Figure 12:
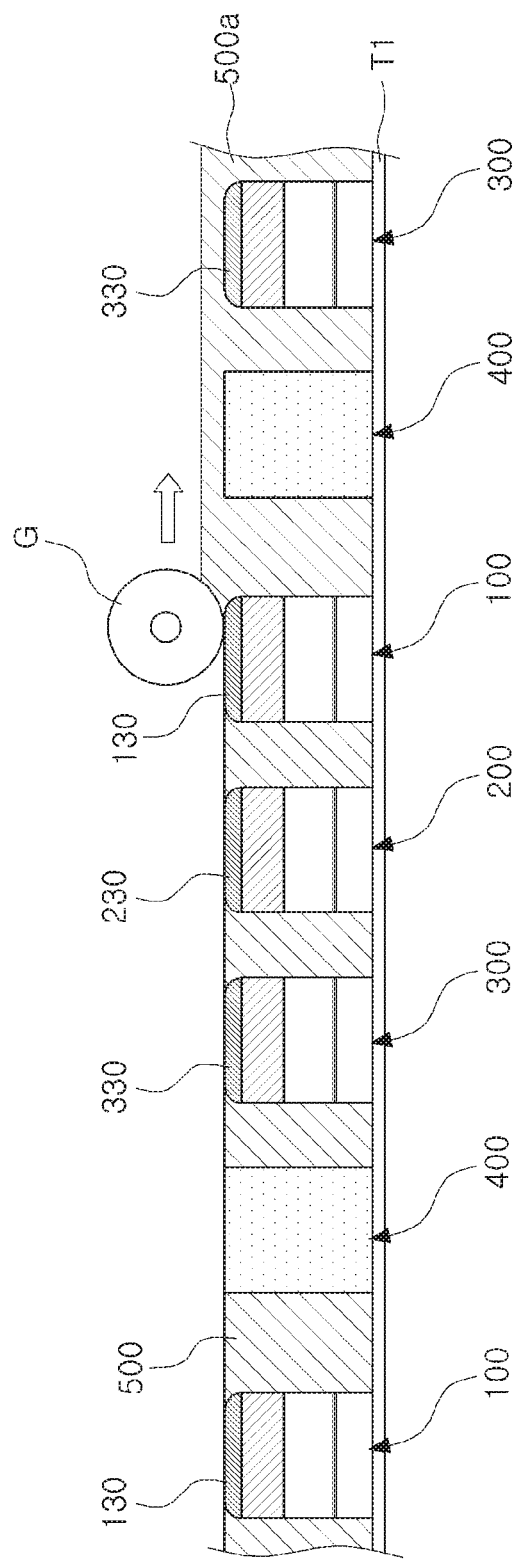

Subsequently, as illustrated in FIG. 12, the molding portion 500 may be formed in such a manner that a black matrix 500a is coated between the first LED chip 100, the second LED chip 200, the third LED chip 300, and the through electrode portion 400. According to an example embodiment, the black matrix 500a is coated to encapsulate the first LED chip 100, the second LED chip 200, the third LED chip 300, and the through electrode portion 400. Thereafter, a grinder G may be used in a process of exposing the individual electrodes 130, 230, and 330 and the through electrode portion 400.

Figure 13:
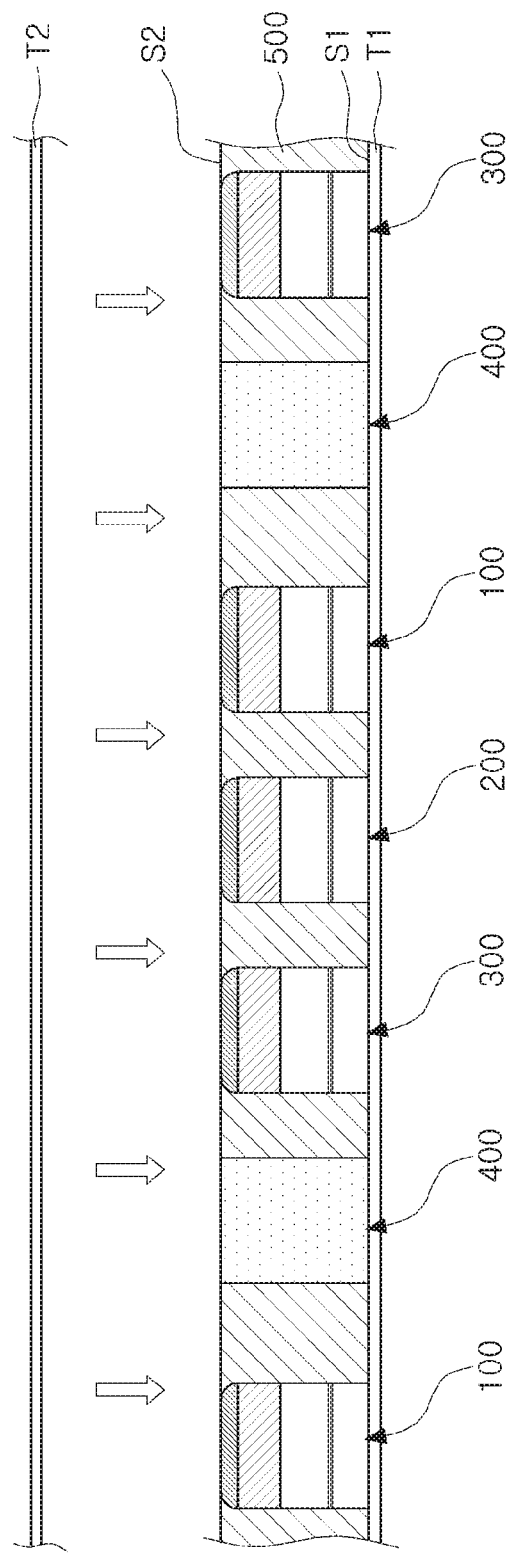

Subsequently, as illustrated in FIG. 13, a second adhesive film T2 may be attached to the second surface S2 of the molding portion 500, and the first adhesive film T1 is removed. Thus, the first LED chip 100, the second LED chip 200, the third LED chip 300, and the through electrode portion 400 are transferred to the second adhesive film T2.

Figure 14:
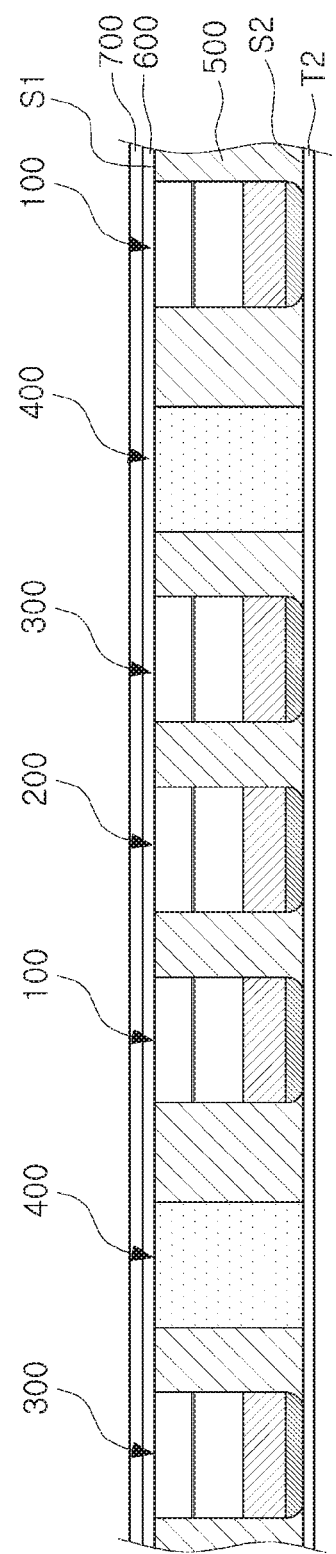

Subsequently, as illustrated in FIG. 14, a transparent electrode layer 600 and a passivation layer 700 may be sequentially formed so as to cover the first surface S1 of the molding portion 500.

Figure 15:
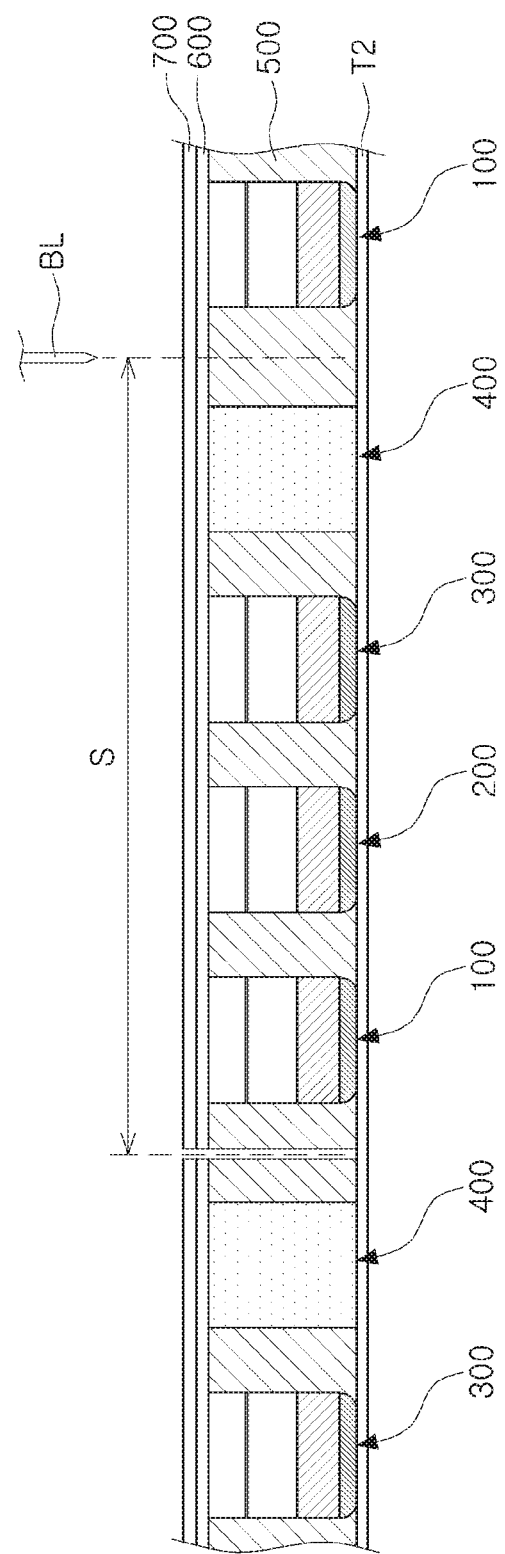

Subsequently, as illustrated in FIG. 15, the molding portion 500 may be cut into pixel units S using a blade BL, and the second adhesive film T2 may be removed, thereby forming the individual light emitting device packages 10 of FIG. 5.

Hereafter, a process of manufacturing the light emitting device package 10a illustrated in FIG. 9 will be described. FIGS. 16 to 19 are schematic, side cross-sectional views illustrating a process of manufacturing a light emitting device package of FIG. 9.

Figure 16:
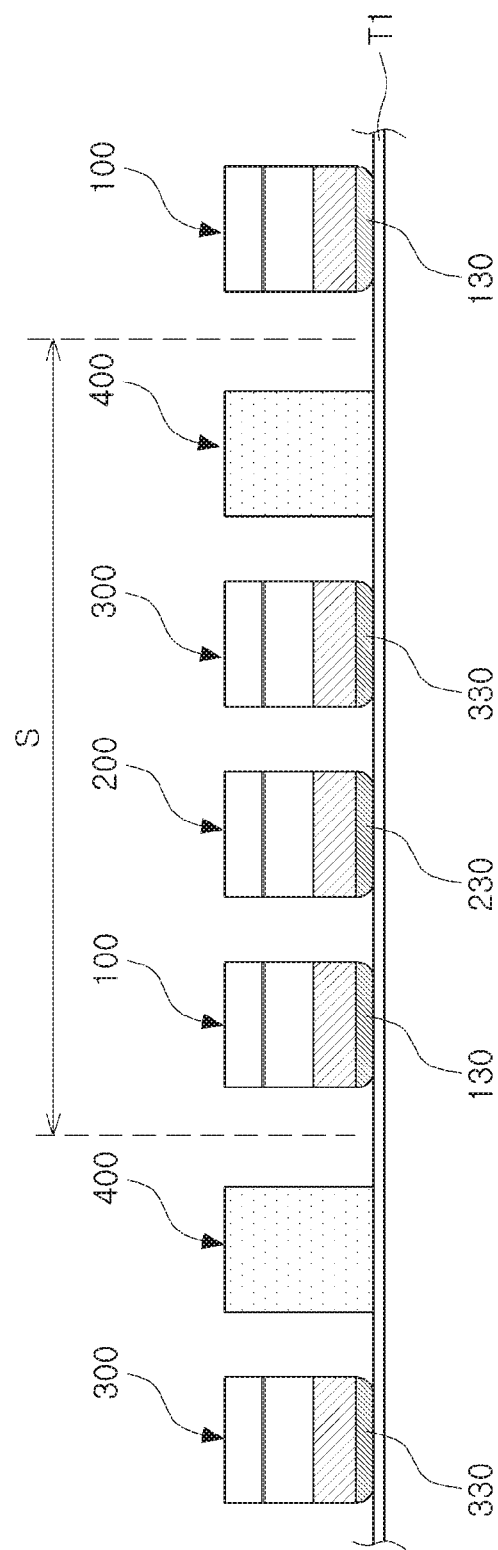
FIGS. 16 to 19 are schematic, side cross-sectional views illustrating a process of manufacturing a light emitting device package according to an example embodiment.

First, as illustrated in FIG. 16, a first LED chip 100, a second LED chip 200, a third LED chip 300, and a through electrode portion 400 may be provided and repeatedly arranged on a surface of a first adhesive film T1 in groups of pixel unit S. In a manner similar to the example embodiment described above, a UV-sensitive film, adhesive strength of which is reduced when UV light is irradiated, may be used as the first adhesive film T1. Individual electrodes 130, 230, and 330 of the first LED chip 100, the second LED chip 200, and the third LED chip 300 may be arranged to be attached to the first adhesive film T1.

Figure 17:
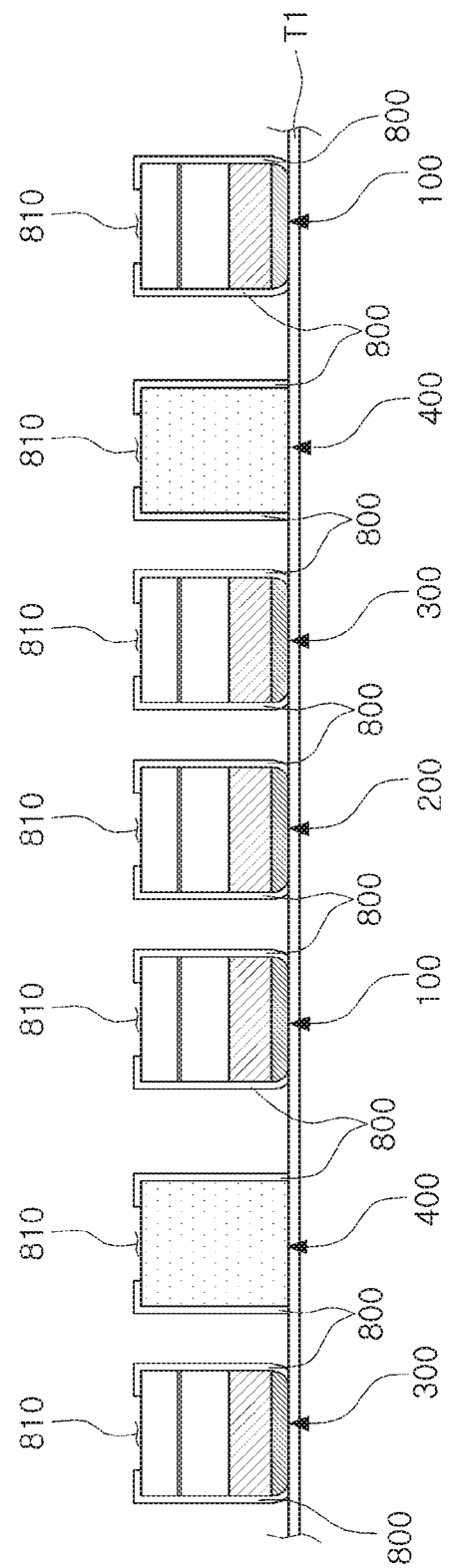

Subsequently, as illustrated in FIG. 17, an insulating layer 800 may be deposited to cover surfaces of the first LED chip 100, the second LED chip 200, the third LED chip 300, and the through electrode portion 400. Openings 810 in the insulating layer 800 may be formed.

Figure 18:
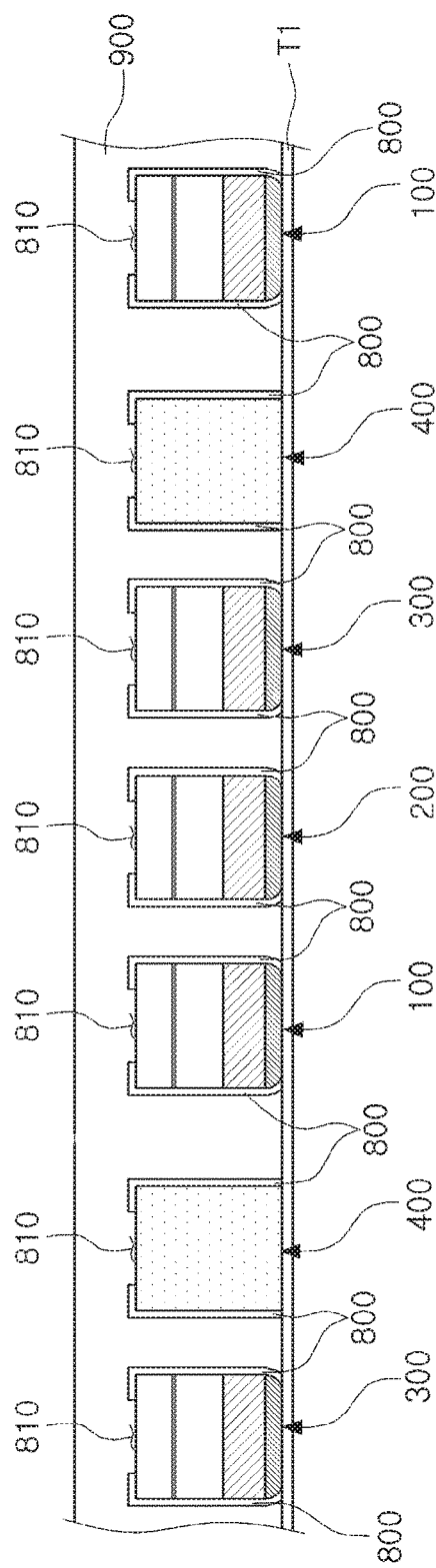

Subsequently, as illustrated in FIG. 18, a light transmissive polymer resin including at least one of an Ag nanowire and a CNT is coated to cover the first LED chip 100, the second LED chip 200, the third LED chip 300, and the through electrode portion 400, thereby forming the molding portion 900.

Figure 19:
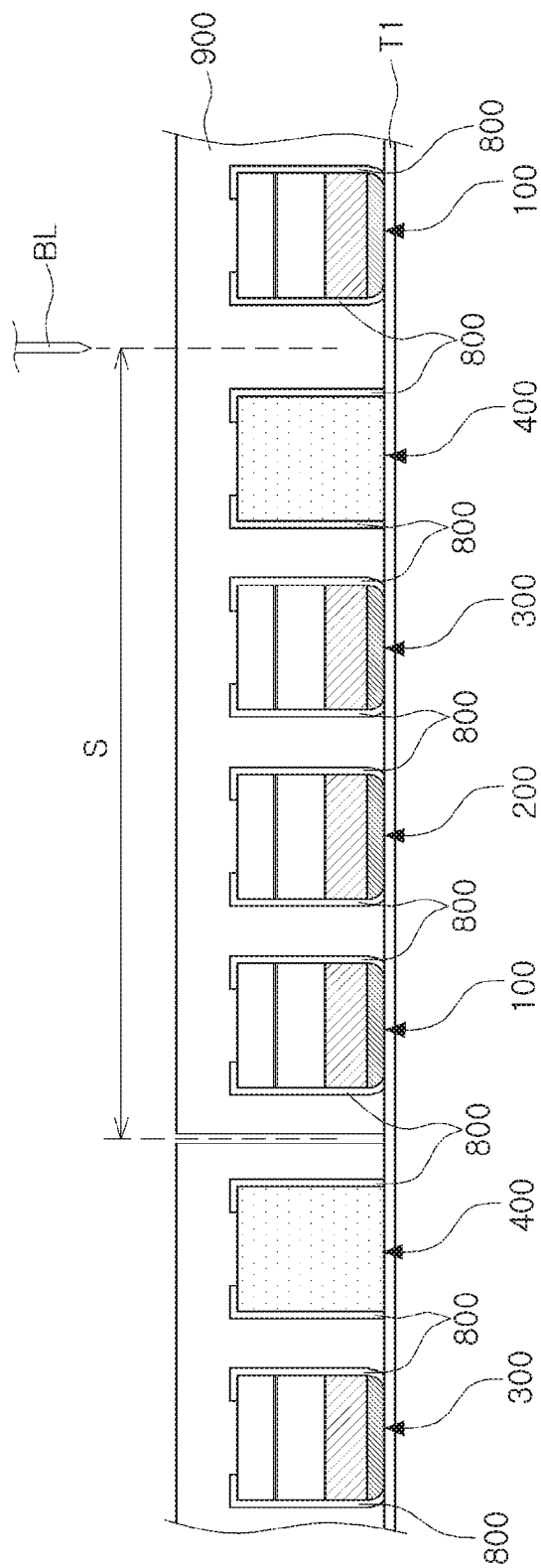

Subsequently, as illustrated in FIG. 19, the molding portion 900 may be cut into pixel units S using a blade BL, and the first adhesive film T1 may be removed to form the individual light emitting device packages 10*a* of FIG. 9.

As set forth above, according to example embodiments, a light emitting device package and a display device using the same may be formed. The light emitting device packages and display devices may be formed with reduce manufacturing time and the display device and may be easily miniaturized.

While example embodiments have been shown and described above, it will be apparent to those skilled in the art that modifications and variations could be made without departing from the scope of the present disclosure as defined by the appended claims.

What is claimed is:

1. A light emitting device package, comprising:
   three light emitting diode (LED) chips configured to emit light having different wavelengths, each of the three LED chips comprising a light emitting structure having a first conductivity-type semiconductor layer, a second conductivity-type semiconductor layer, and an active layer interposed between the first conductivity-type semiconductor layer and the second conductivity-type semiconductor layer;
   a through electrode portion disposed adjacent to the three LED chips;
   a molding portion encapsulating respective side surfaces of the three LED chips and the through electrode portion to connect the three LED chips and the through electrode portion to each other;
   a transparent electrode layer disposed on a first surface of the molding portion, the three LED chips, and the through electrode portion; and
   three individual electrodes exposed through a second surface of the molding portion and disposed on the three LED chips, respectively,
   wherein the three LED chips and the through electrode portion are arranged in a 2×2 matrix of two rows and two columns.

2. The light emitting device package of claim 1, wherein the through electrode portion comprises at least one among a metal, a metal polymer composite, a zener diode, and a varistor.

3. The light emitting device package of claim 1, wherein the through electrode portion is connected to each of the three LED chips in series.

4. The light emitting device package of claim 1, wherein the three LED chips comprise a first light emitting structure, a second light emitting structure, and a third light emitting structure, respectively, and the active layer of the first light emitting structure, the active layer of the second light emitting structure, and the active layer of the third light emitting structure emit red light, green light, and blue light, respectively.

5. The light emitting device package of claim 4, wherein the molding portion is interposed between each of the three LED chips and the through electrode, and
   wherein the molding portion surrounds the 2×2 matrix of the three LED chips and the through electrode.

6. The light emitting device package of claim 4, wherein a first gap between the first light emitting structure and the through electrode portion is greater than each of a second gap between the second light emitting structure and the through electrode portion and a third gap between the third light emitting structure and the through electrode portion.

7. The light emitting device package of claim 4, wherein the first light emitting structure comprises a material different from the second light emitting structure and the third light emitting structure.

8. The light emitting device package of claim 7, wherein the first light emitting structure comprises gallium arsenide (GaAs), and
   wherein the second light emitting structure and the third light emitting structure comprise gallium nitride (GaN).

9. The light emitting device package of claim 1, wherein each of the three LED chips further comprises a support substrate interposed between the second conductivity-type semiconductor layer and an individual electrode of the three individual electrodes.

10. The light emitting device package of claim 9, wherein the support substrate comprises a conductive material or a semi-conductive material.

11. The light emitting device package of claim 1, wherein the molding portion is configured to form a black matrix or a transparent matrix.

12. The light emitting device package of claim 1, wherein the molding portion is integrally formed using a material of the transparent electrode layer,
   wherein the light emitting device package further comprises an insulating layer disposed to cover the respective side surfaces of the three LED chips and the through electrode portion.

13. The light emitting device package of claim 12, wherein the molding portion comprises a light transmissive polymer resin comprising at least one among a silver (Ag) nanowire and a carbon nanotube (CNT).

14. The light emitting device package of claim 1, further comprising a passivation layer covering the transparent electrode layer.

15. A light emitting device package, comprising:
   a transparent electrode layer;
   a plurality of light emitting diode (LED) chips configured to emit light having different wavelengths, spaced apart from each other and disposed on the transparent electrode layer, each of the plurality of LED chips having a first surface connected to the transparent electrode layer and a second surface opposite the first surface, and the transparent electrode layer being provided as a common electrode of the plurality of LED chips;
   a plurality of individual electrodes, each of which is disposed on the second surface of the plurality of LED chips, respectively;
   a through electrode portion having a first through electrode portion surface connected to the transparent electrode layer and a second through electrode portion surface disposed opposite the first through electrode portion surface; and
   a molding portion encapsulating the plurality of LED chips and the through electrode portion, through which the plurality of individual electrodes and the second through electrode portion surface are exposed,
   wherein the plurality of LED chips and the through electrode portion are arranged in a matrix of at least two rows and at least two columns.

16. The light emitting device package of claim 15, wherein first surfaces of the plurality of LED chips have a same area.

17. The light emitting device package of claim 15, wherein first surfaces of the plurality of LED chips are coplanar with each other.

18. A display device, comprising:
a display panel comprising a circuit board and a plurality of light emitting device packages disposed on the circuit board in rows and columns;
a panel driver configured to drive the display panel; and
a controller configured to drive the panel driver,
wherein each of the plurality of light emitting device packages comprises a plurality of light emitting diode (LED) chips configured to emit light having different wavelengths,
wherein each of the plurality of LED chips comprises a first conductivity-type semiconductor layer, a second conductivity-type semiconductor layer, an active layer interposed between the first conductivity-type semiconductor layer and the second conductivity-type semiconductor layer, a first surface provided by the first conductivity-type semiconductor layer and a second surface opposite the first surface,
wherein each of the plurality of light emitting device packages comprises a molding portion encapsulating respective side surfaces of the plurality of LED chips, a transparent electrode layer disposed on the first surface of the plurality of LED chips and electrically connected to the first conductivity-type semiconductor layer of the plurality of LED chips, a through electrode portion penetrating through the molding portion to connect to the transparent electrode layer, and a plurality of individual electrodes, each which is disposed on the second surface of the plurality of LED chips and exposed to the molding portion, and
wherein the plurality of LED chips and the through electrode portion are arranged in a matrix of at least two rows and at least two columns.

19. The display device of claim 18, wherein the through electrode portion comprises at least one among a metal, a metal polymer composite, a varistor, and a zener diode, and
wherein a resistance value of the through electrode of each of the plurality of light emitting device packages is individually adjusted so a driving voltage of each of the plurality of light emitting device packages is uniform.

20. The display device of claim 18, wherein each of the plurality of light emitting device packages comprises a plurality of pixels disposed in rows and columns.

* * * * *